United States Patent
Oberhuber

(10) Patent No.: US 7,436,701 B2
(45) Date of Patent: Oct. 14, 2008

(54) SINGLE POLY EPROM DEVICE WITH DOUBLE CONTROL GATES TO PREVENT UNINTENTIONALLY CHARGING/DISCHARGING

(75) Inventor: Ralph Oberhuber, Kumhausen (DE)

(73) Assignee: Texas Instruments incorporated, Dallas, TX (US)

( * ) Notice: Subject to any disclaimer, the term of this patent is extended or adjusted under 35 U.S.C. 154(b) by 292 days.

(21) Appl. No.: 11/314,587

(22) Filed: Dec. 21, 2005

(65) Prior Publication Data

US 2006/0133151 A1  Jun. 22, 2006

(30) Foreign Application Priority Data

Dec. 22, 2004  (DE)  .................. 10 2004 061 921

(51) Int. Cl.
*G11C 16/04* (2006.01)
(52) U.S. Cl. .................. 365/185.02; 365/51; 365/63
(58) Field of Classification Search ........... 365/185.02, 365/51, 63; 257/319, 321
See application file for complete search history.

(56) References Cited

U.S. PATENT DOCUMENTS

| 5,790,455 | A | | 8/1998 | Caywood |
| 5,798,548 | A | * | 8/1998 | Fujiwara ..................... 257/319 |
| 6,433,609 | B1 | * | 8/2002 | Voldman ..................... 327/313 |
| 6,535,430 | B2 | * | 3/2003 | Ogura et al. ........... 365/185.23 |
| 2001/0025980 | A1 | | 10/2001 | Bottini et al. |

* cited by examiner

*Primary Examiner*—VanThu Nguyen
(74) *Attorney, Agent, or Firm*—Frederick J. Telecky, Jr.; Wade J. Brady, III

(57) ABSTRACT

A single poly EPROM comprises a floating gate (10), a control gate (12), a source (16) and a drain (18). The control gate (12) is positioned laterally of a channel between the source (16) and the drain (18). The floating gate (10) is positioned above the channel and above the control gate (12). The single poly EPROM device further comprises an additional gate (40) above the floating gate (10) and a control. The control is connected to the additional gate (40) for controlling a voltage at the floating gate (10) in order to prevent the floating gate (10) from being unintentionally charged or discharged.

4 Claims, 2 Drawing Sheets

SINGLE POLY EPROM DEVICE WITH DOUBLE CONTROL GATES TO PREVENT UNINTENTIONALLY CHARGING/DISCHARGING

BACKGROUND

The term EPROM stands for electronically programmable read-only memory. In contrast to random access memories (RAMs), an EPROM comprises a memory, which retains information, even if the power supply to the memory is switched off. The EPROM device commonly comprises a field effect transistor having a source, a drain and a conduction channel between the source and drain. Additionally, the field effect transistor has a gate floating above channel. The floating gate is electrically isolated. Information is stored by injecting charges on the floating gate. Due to its isolation, the charges remain on the floating gate, even if the power supply is switched off. The charges on the floating gate effect the conductance channel between the source and the drain of the field effect transistor. The information may be retrieved from the memory device by measuring the current flowing between the source and the drain.

A top view of a more advanced EPROM device, called a Single Poly EPROM device, is shown in FIG. 1. The Single Poly EPROM device of FIG. 1 comprises a floating gate 10, a control gate 12, a source 16 and a drain 18. Source 16, drain 18 and floating gate 10 form a field effect transistor, wherein the floating gate 10 represents the gate of the field effect transistor. The channel between source 16 and drain 18 is covered by a part of the floating gate 10 in FIG. 1. A back gate contact 14b, a drain contact 14D and a source contact 14S are connected to a back gate 10, the source 18 and the drain 16, respectively. The peculiarity of the Single Poly EPROM device is that the control gate 12 is not formed by a conductive layer on top of the floating gate 10, but by a doped semiconductor region underlying part of the floating gate 10. The floating gate 10 is made out of a poly-silicon layer on top of both the channel of the field effect transistor and the control gate 12. Two control gate contacts 14C are connected to the control gate 12 (although a simple control gate is sufficient for functionality).

FIG. 2 shows a schematic cross section of the Single Poly EPROM device of FIG. 1. The floating gate 10 is situated above both the control gate 12 and the channel between source 16 and drain 18. A back gate 20 shown in FIG. 2 has the same purpose as in standard MOS transistors. Reference sign C1 depicts the capacitance between the floating gate 10 and the control gate 12 of the Single Poly EPROM device shown in FIG. 2. Single Poly EPROM devices can be programmed either through hot carrier injection or Fowler-Nordheim tunneling. A thin gate oxide is provided as isolator between the floating gate 10 and the channel region. The channel region can be used for tunneling between the floating gate 10 and source 16/drain 18.

FIG. 3 illustrates the configuration of a conventional memory array consisting of Single Poly EPROM devices 32 and select transistors 30. One Single Poly EPROM device 32 connected to a selected transistor 30 forms a memory cell in the array. The memory cells are grouped in columns Coll, Colt and rows ROW1, ROW2. The select transistor 30 is a high voltage transistor, which is connected to the Single Poly EPROM device in order to protect the floating gate 10 against the high programming voltage. Otherwise, a high voltage applied to the drain 18 of the Single Poly EPROM device 32 during erasing would also appear at the drain 18 of the other unselected cells in the same memory column COL1, COL2. Consequently, the memory cell must consist of two transistors 30 and 32 as shown in FIG. 3. This select transistor 30 is needed to prevent programming if the transistor is not selected. If each Single Poly EPROM cell has to be programmable individually, then each Single Poly EPROM cell has to contain one select transistor 30. Therefore, the total area of the array is significantly increased by the high voltage select transistors 30.

SUMMARY

The Single Poly EPROM device according to the invention does not need a dedicated select transistor for protecting its drain. Therefore, less area is needed in a memory array comprising the Single Poly EPROM devices according to the invention.

The Single poly EPROM device according to the invention comprises a floating gate, a control gate, a source and a drain. The control gate is positioned laterally of a channel between the source and the drain. The floating gate is positioned above both the channel and the control gate. An additional gate is provided above the floating gate. A control is connected to the additional gate for controlling a voltage at the floating gate in order to prevent that the floating gate is unintentionally charged or discharged. The floating gate voltage may be influenced by the voltage at the additional gate. Consequently, the voltage drop between the floating gate and the source or drain of the Single Poly EPROM device may be controlled in such a way, that the floating gate is not unintentionally charged or discharged. Therefore, the Single Poly EPROM device does not need a select transistor.

Preferably, the control comprises a tri-state buffer having a buffer output connected to the additional gate. The tri-state buffer comprises a buffer input and a select input for selectively passing the buffer input to the buffer output. The tri-state buffer works as a buffer when a select signal is applied so that the input signal is transferred to the buffer output. Otherwise, the tri-state buffer output is floating. Plural Single Poly EPROM devices may be connected to a single tri-state buffer output in order to prevent unintentional programming or erasing.

The programming of a Single Poly EPROM device is carried out by disconnecting the buffer output from the buffer input of the tri-state buffer, and applying a programming voltage to the control gate so that the floating gate is charged or discharged. Preferably the drain terminal is connected to ground. The buffer output and consequently the additional gate are floating. In this state, the voltage drop between the control gate and the floating gate is equal to the programming voltage multiplied by a coupling ratio. The additional gate has virtually no effect on the coupling ratio. The Single Poly EPROM device is programmed by the Fowler-Nordheim tunneling effect. This effect allows electrons to pass through the insulator between the floating gate and the channel, although their energy is too low to surmount the energy barrier. The Single Poly EPROM device may be erased by applying the programming voltage to the drain and connecting the control gate to ground.

Unintentionally programming or erasing of the Single Poly EPROM device according to the invention may be prevented by passing the buffer input to the buffer output of the tri-state buffer and applying a predetermined voltage to the buffer input. In particular, the buffer input may be connected to ground potential. Consequently, the voltage drop between the control gate and the additional gate is equal to the programming voltage. The floating gate is connected in series to the additional gate and the control gate. The voltage at the floating gate lies between ground voltage and the programming voltage. The voltage drop between the drain and the floating gate is too small to allow Fowler-Nordheim tunneling.

Preferably, the Single Poly EPROM devices according to the present invention are used as memory cells in a semiconductor memory. Plural rows of Single Poly EPROM devices may be provided in the semiconductor memory device. The additional gates of each Single Poly EPROM device situated in one row may all be connected in parallel to the buffer output of a single tri-state buffer. Therefore, each Single Poly EPROM device in a row may be protected from unintentional programming or erasing by appropriately controlling the tri-state buffer connected to the Single Poly EPROM devices in one row. A significant area reduction can be achieved in this way, since only one tri-state buffer for each row is required in contrast to the conventional architecture, where one high voltage select transistor is required for each memory cell.

BRIEF DESCRIPTION OF THE DRAWINGS

A preferred embodiment of the present invention is described hereinafter with reference to the accompanying drawings.

DETAILED DESCRIPTION

Figure 1:
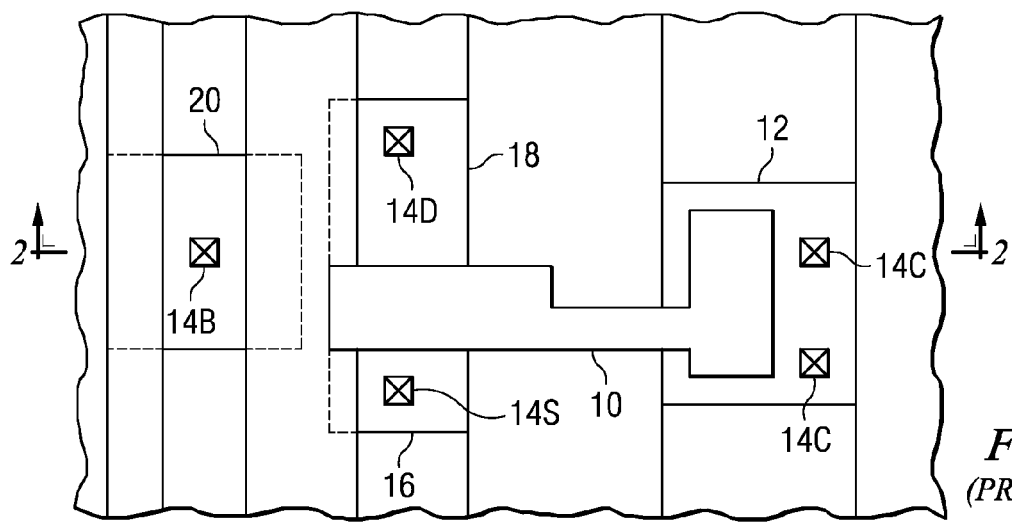
FIG. 1 shows a schematic top view of a conventional Single Poly EPROM device.
Figure 2:
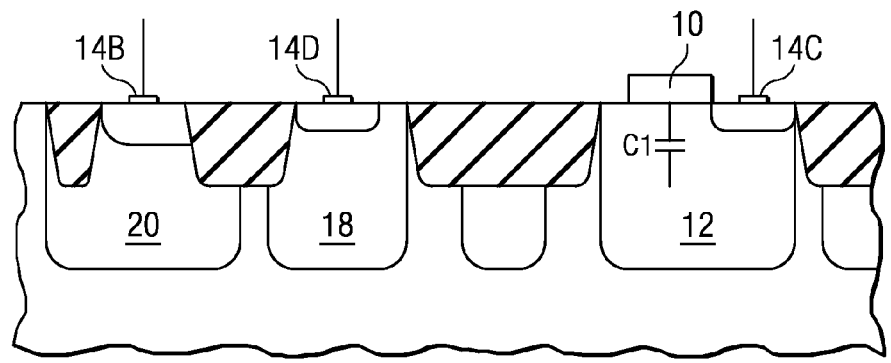
FIG. 2 shows a schematic cross section of the Single Poly EPROM device shown in FIG. 1.
Figure 3:
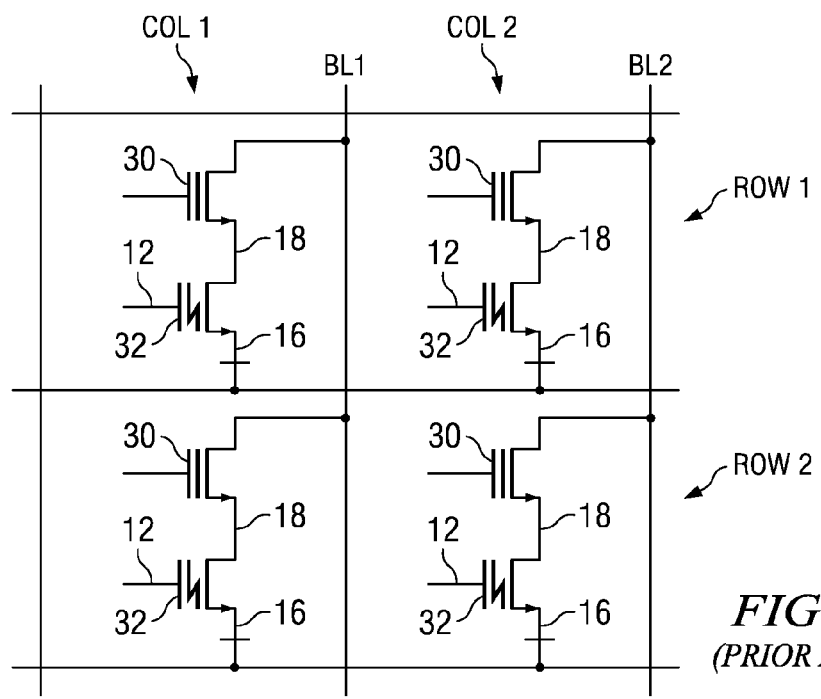
FIG. 3 shows illustrates schematically the configuration of a conventional semiconductor memory comprising conventional Single Poly EPROM devices.
Figure 4:
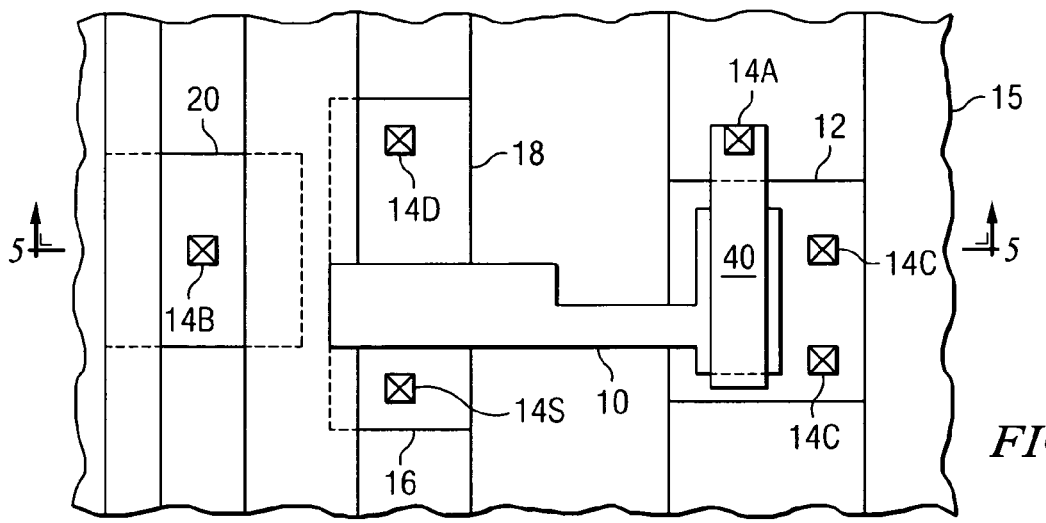
FIG. 4 shows a schematic top view of a Single Poly EPROM device according to the embodiment of the present invention.

The Single Poly EPROM device according to the embodiment of FIG. 4 comprises an additional gate 40, a floating gate 10 and a control gate 12. A section of the floating gate 10 is positioned between the additional gate 40 and the control gate 12. In other words, this section of the floating gate 10 is sandwiched between the control gate 12 and the additional gate 40. Both the additional gate 40 and the control gate 12 have contacts, namely an additional gate contact 14A and a drain contact 14C, whereas the floating gate 10 is completely isolated. Furthermore, the Single Poly EPROM device of FIG. 4 comprises a source 16 and a drain 18. A channel between source 16 and drain 18 is covered by a section of the floating gate 10. Therefore, the floating gate 10 controls the conductivity of the channel. The floating gate 10, the drain 18 and the source 16 comprise a field effect transistor.

Preferably, the field effect transistor is a metal-oxide semiconductor FET having an N-channel (enhancement MOSFET). In this case, both the drain 18 and the source 16 are n-doped. The channel between source 16 and drain 18 is p-doped. A silicon dioxide layer insulates the floating gate 10 from the n-channel. The floating gate 10 is made out of poly-silicon. The additional gate 40 is either made out of a second poly-silicon layer or a TiN-layer (although any conducting layer can be used). Silicon dioxide layers isolate the additional gate 40 from the floating gate 10 and the control gate 12 from the floating gate 10. The source 16, the drain 18 and the control gate 12 comprise n-doped areas within a p-doped bulk area 15. A back gate 20 is connected to the bulk area 15. The purpose of a back gate 20 is the same as in conventional integrated MOSFET devices.

Figure 5:
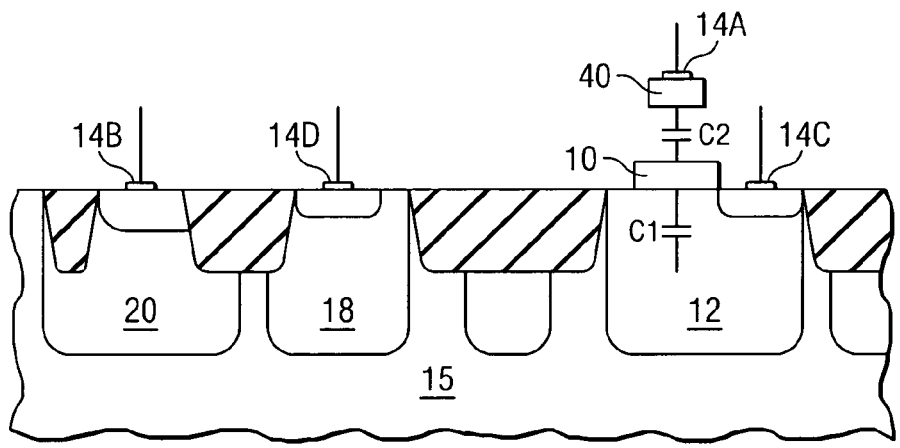
FIG. 5 shows a schematic cross section of the Single Poly EPROM device according to the embodiment shown in FIG. 4.

FIG. 5 shows schematically a cross section of the Single Poly EPROM device shown in FIG. 4. This cross section is taken approximately in the plane indicated by the reference sign h in FIG. 4. The control gate 12 is positioned laterally to the drain 18. Both areas are n-doped. The floating gate 10 is made out of poly-silicon and is positioned above both the drain 18 and the control gate 12 shown in FIG. 5. The floating gate 10 is electrically isolated from the control gate 12. Reference sign C1 depicts a capacitance between the control gate 12 and the floating gate 10. Furthermore, the additional gate 40 is positioned above the floating gate 10. Reference numeral C2 depicts the capacitance between the additional gate 40 and the floating gate 10. The capacitances C1 and C2 are connected in series to each other.

In first order, the voltage at the floating gate 10 is determined by the voltage drop between the additional gate 40 and the control gate 12 as well as the capacitances C1 and C2 shown in FIG. 5. The size of the capacitances C1 and C2 is determined by the geometry of the gates 40, 10 and 12 as well as the insulating layers between these gates. The additional gate 40 is connected to the output of a tri-state buffer 60.

The tri-state buffer 60 may be controlled to pass its buffer input 64 to its buffer output 62 by appropriately selecting the select input 68 equal to "0". The buffer input 64 is connected to ground potential GND and a programming voltage VPP is applied to the control gate 12. In this case, the voltage drop between control gate 12 and additional gate 40 is equal to the programming voltage VPP. If the capacitances C1 and C2 are equal, then the voltage of the floating gate 10 will be <½*VPP. No programming will occur, because the voltage between the drain 18 and the floating gate 10 is too small to allow Fowler-Nordheim tunneling.

Alternatively, the buffer output is made to be floating by appropriately selecting the select input 68 equal to "1". Consequently, the additional gate 40 is floating. The drain 18 is connected to ground potential GND. The voltage drop between control gate 12 and floating gate is equal to the programming voltage VPP multiplied by a coupling ratio. Fowler-Nordheim occurs and the Single Poly EPROM device is programmed. An erasure of the Single Poly EPROM device is carried out by applying the programming voltage to the ground 18 and applying ground potential to the control gate.

Figure 6:
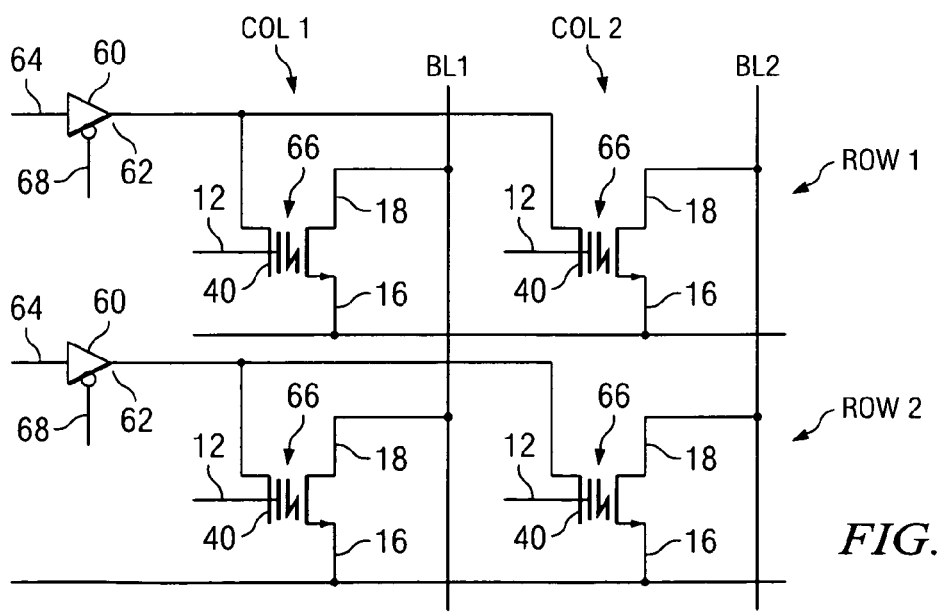
FIG. 6 illustrates schematically the configuration of a semiconductor memory comprising plural rows of Single Poly EPROM devices according to the embodiment of the present invention.

FIG. 6 illustrates schematically an array of Single Poly EPROM devices 66 according to the embodiment of the present invention. Each of the Single Poly EPROM devices 66 has a control gate 12 and an additional gate 40. The particular layout of each of the Single Poly EPROM devices 66 is depicted in FIGS. 4 and 5. The Single Poly EPROM devices 66 are aligned in rows ROW1, ROW2 and columns COL1 and COL2. The drains 18 of each Single Poly EPROM device 66 are connected to a bit line BL1, BL2. The sources 16 of each Single Poly EPROM device 66 in a single column COL1, COL2 are connected to each other.

Furthermore, two tri-state buffers 60 are shown in FIG. 6. The additional gates 40 of the Single Poly EPROM devices 66 in one row ROW1, ROW2 are connected to the output 62 of a single tri-state buffer 60. Each tri-state buffer 60 also comprises a buffer input 64 and a select input 68. The state of the tri-state buffer 60 is determined by a select signal fed to the select input 68. If the select signal is equal to zero, then the tri-state buffer 60 transfers the select signal to the buffer output 62. If the select signal is equal to 1, then the buffer 62 output is floating. Consequently, the voltage at the additional gate 40 of the Single Poly EPROM devices 66 in a single row ROW1, ROW2 may be controlled by one tri-state buffer 60. If programming or erasing of one of the Single Poly EPROM devices 66 is to be carried out, then the tri-state buffer 60 in the corresponding row ROW1, ROW2 is controlled in such a way, that the buffer output 62 is floating. However, the remaining buffer outputs 62 are used to control the voltage of the additional gate 40. The voltage applied to the drain 18 of the Single Poly EPROM device 66 for programming or erasing may not charge or discharge the floating gates 10 of the remaining Single Poly EPROM devices 66. No select transistors as in the conventional memory array is necessary for protecting the drains 18 of the Single Poly EPROM devices 66 in the memory array. Consequently, the area of the memory array may be considerably reduced.

What is claimed is:

1. A Single Poly EPROM device comprising:
   a floating gate;
   a control gate;
   a source;
   a drain; the control gate positioned laterally of a channel between the source and the drain, and the floating gate positioned above the channel and above the control gate;
   an additional gate above the floating gate; and
   a control connected to the additional gate for controlling a voltage at the floating gate in order to prevent the floating gate from being unintentionally charged or discharged.

2. The device as in claim 1, wherein the control comprises a tri-state buffer having a buffer output connected to the additional gate, a buffer input, and a select input for selectively passing the buffer input to the buffer output.

3. The device as in claim 1, wherein the device is an electrically erasable Single Poly EPROM device.

4. A semiconductor memory device, comprising
   plural rows of Single Poly EPROM devices, wherein each of the Single Poly EPROM devices comprises;
   a floating gate;
   a control gate;
   a source;
   a drain the control gate positioned laterally of a channel between the source and the drain, and the floating gate positioned above the channel and above the control gate;
   an additional gate above the floating gate; and
   a control connected to the additional gate for controlling a voltage at the floating gate in order to prevent the floating gate from being unintentionally charged or discharged; wherein the control comprises
   plural tri-state buffers, each having a buffer output [ ], wherein the additional gates of each Single Poly EPROM device in one row are connected in parallel to the buffer output of a respective one of the tri-state buffers.

* * * * *